United States Patent [19]
McGettigan

[11] Patent Number: 6,157,209
[45] Date of Patent: Dec. 5, 2000

[54] LOADABLE UP-DOWN COUNTER WITH ASYNCHRONOUS RESET

[75] Inventor: Edward S. McGettigan, San Jose, Calif.

[73] Assignee: Xilinx, Inc., San Jose, Calif.

[21] Appl. No.: 09/216,277

[22] Filed: Dec. 18, 1998

[51] Int. Cl.[7] .................................................. G06F 7/38
[52] U.S. Cl. .................................. 326/39; 326/38; 326/39
[58] Field of Search .................................. 326/38, 39, 40, 326/41, 46

[56] References Cited

U.S. PATENT DOCUMENTS

| 5,682,107 | 10/1997 | Tavana et al. | 326/41 |
| 5,889,411 | 3/1999 | Chaudhary | 326/39 |
| 5,920,202 | 7/1999 | Young et al. | 326/39 |

OTHER PUBLICATIONS

Xilinx, Inc., "Libraries Guide, Xilinx Development System," Jan. 1998, pp. 3–89 through 3–91, 3–93.

*Primary Examiner*—Michael Tokar
*Assistant Examiner*—Ann Tran
*Attorney, Agent, or Firm*—Edel M. Young; Scott R. Brown, Esq.

[57] ABSTRACT

In an FPGA having four-input lookup tables (LUTs) with parallel two-input AND gates receiving two of the four LUT input signals, associated registers, and a carry chain receiving one input signal from the AND gate output, a loadable up-down counter is formed by connecting the register output to one of the terminals serving as both a LUT input terminal and an AND gate input terminal. A load control signal is connected to another input terminal common to the LUT and the AND gate. Thus the AND gate disables the carry chain during loading of the counter and applies the count value to the carry chain during counting.

7 Claims, 5 Drawing Sheets

6,157,209

LOADABLE UP-DOWN COUNTER WITH ASYNCHRONOUS RESET

RELATED APPLICATION

This application is related to U.S. patent application Ser. No. 08/786,818 filed by Chapman and Young on Jan. 21, 1997, and assigned to the assignee of the present invention, the content of which is incorporated herein by reference.

FIELD OF THE INVENTION

The invention relates to programmable functions implemented in programmable integrated circuit devices.

BACKGROUND

Programmable integrated circuit devices are powerful logic devices able to implement many logic functions. Field programmable gate array devices having programmable logic blocks and programmable interconnect structure are a particularly powerful form of such devices. Several families of field programmable gate array devices available from Xilinx, Inc., assignee of the present invention, include a fast carry path able to speed up certain functions, particularly arithmetic functions in which the slowest part of the operation is rippling the carry signal from one bit to the next in a large number.

FIG. 1 shows a logic block structure available in the Xilinx XC5200 devices, which is described in detail by Tavana et al. in U.S. Pat. No. 5,682,107, the contents of which is incorporated herein by reference. FIG. 1 shows four adjacent stages, the F-stage, G-stage, H-stage, and J-stage having adjacent four-input lookup tables F, G, H, and J and an associated carry chain including carry multiplexers C1, C2, C3, and C4. Also included are registers RX, RY, RZ, and RV able to receive respective data input signals from lookup tables (LUTs) F, G, H, and J, respectively. Various multiplexers route signals between the LUT, carry multiplexer, and registers of a stage. In particular, multiplexers D1–D4 select between routing the LUT output signal and the carry multiplexer output signal to the register.

Similar architectures are also known, in particular one in which XOR gates replace multiplexers D1–D4. Combining the LUT output signal and the carry-in signal in an XOR gate as input to the register allows both carry and sum portions of an arithmetic function to be efficiently generated.

A loadable up-down counter can be formed using the structure of FIG. 1. Such an implementation was published in January 1998 by Xilinx, Inc. in the "Libraries Guide, Xilinx Development System" at pages 3–89 through 3–91 and 3–93. That publication is incorporated herein by reference. However, each bit of this loadable up-down counter requires 3 LUTs. It would be desirable to achieve a higher density in such counters.

SUMMARY OF THE INVENTION

The present invention provides a particularly efficient method of forming a counter in an FPGA structure having a carry chain and having a dedicated AND gate associated with each LUT for providing input to the carry multiplexer controlled by the LUT output signal. The counter can be a loadable up-down counter. The initial count value is loaded into successive LUTs, and moved at the next clock cycle to associated registers. Each register output signal is provided as one of the input signals to the associated LUT and also the associated AND gate. Therefore this value is available as an input signal to the associated carry multiplexer, and when the counter is placed into its counting mode, it forms an input signal to the next carry multiplexer along the carry chain, selected if the next LUT determines the previous multiplexer output should be forwarded.

DETAILED DESCRIPTION

Figure 1:
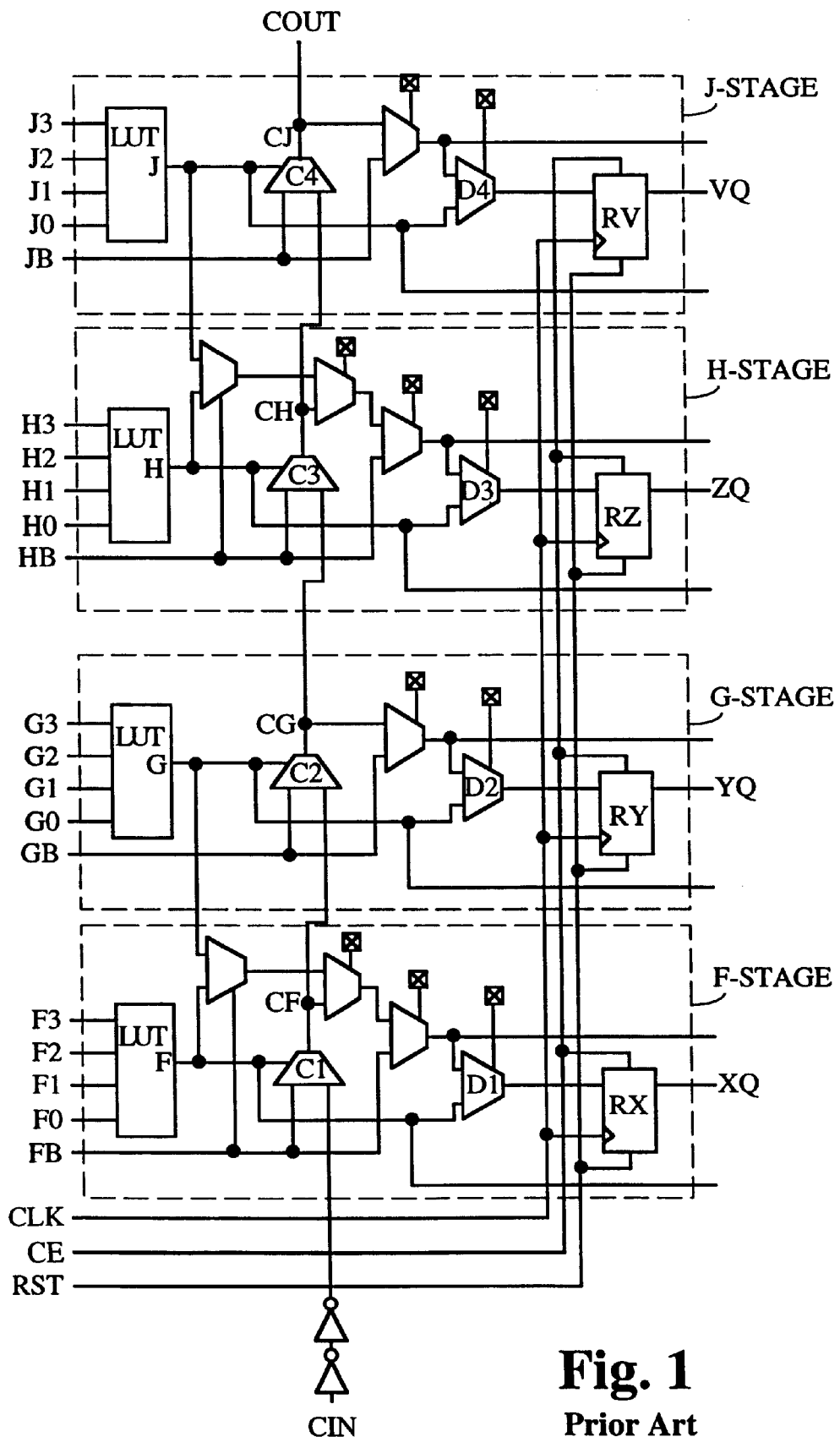
FIG. 1 shows a prior art FPGA logic block architecture.
Figure 2:
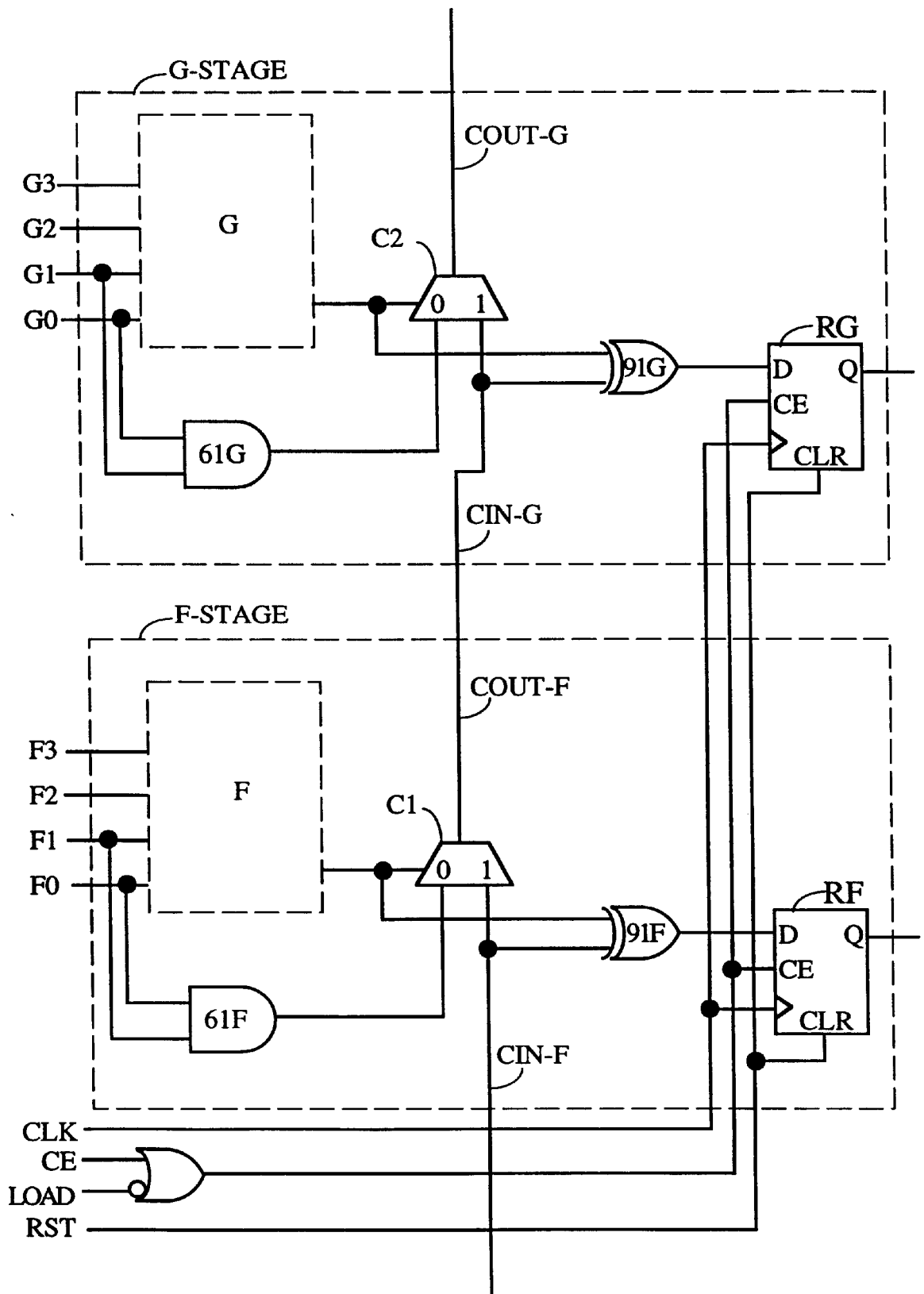
FIG. 2 shows a recent FPGA logic block architecture including an AND gate in parallel with a LUT, with which the invention may be used.

FIG. 2 illustrates a further architectural improvement to the logic block structure of FIG. 1, which is described in related patent application Ser. No. 08/786,818. In the architecture of FIG. 2, a dedicated two-input AND gate drives an input terminal of the carry chain multiplexer controlled by the LUT. Two stages of a carry chain are shown, an F-stage and a G-stage. Each comprises a LUT, an AND gate, a carry multiplexer, an XOR gate, and a register. In the F-stage are LUT F receiving input signals F0, through F3, AND gate 61F receiving input signals F0 and F1, carry multiplexer C1 receiving as input signals the output signal from AND gate 61F and input signal CIN-F from a lower stage in the carry chain, XOR gate 91F receiving the output signal from LUT F and input signal CIN-F from a lower stage in the carry chain, and register RF receiving as a data input signal the output of XOR gate 91F. Register RF also receives a clock enable signal CE, a clock signal CLK, and a reset or clear signal, in this case illustrated as a clear signal CLR. The CE input signal to register RF and RG is generated by implementing the illustrated OR gate in another lookup table not shown. The dedicated AND gates 61F and 61G are particularly useful for multiplication, as described in related application Ser. No. 08/786,818, and for certain wide logic functions such as wide AND and wide OR.

Figure 3:
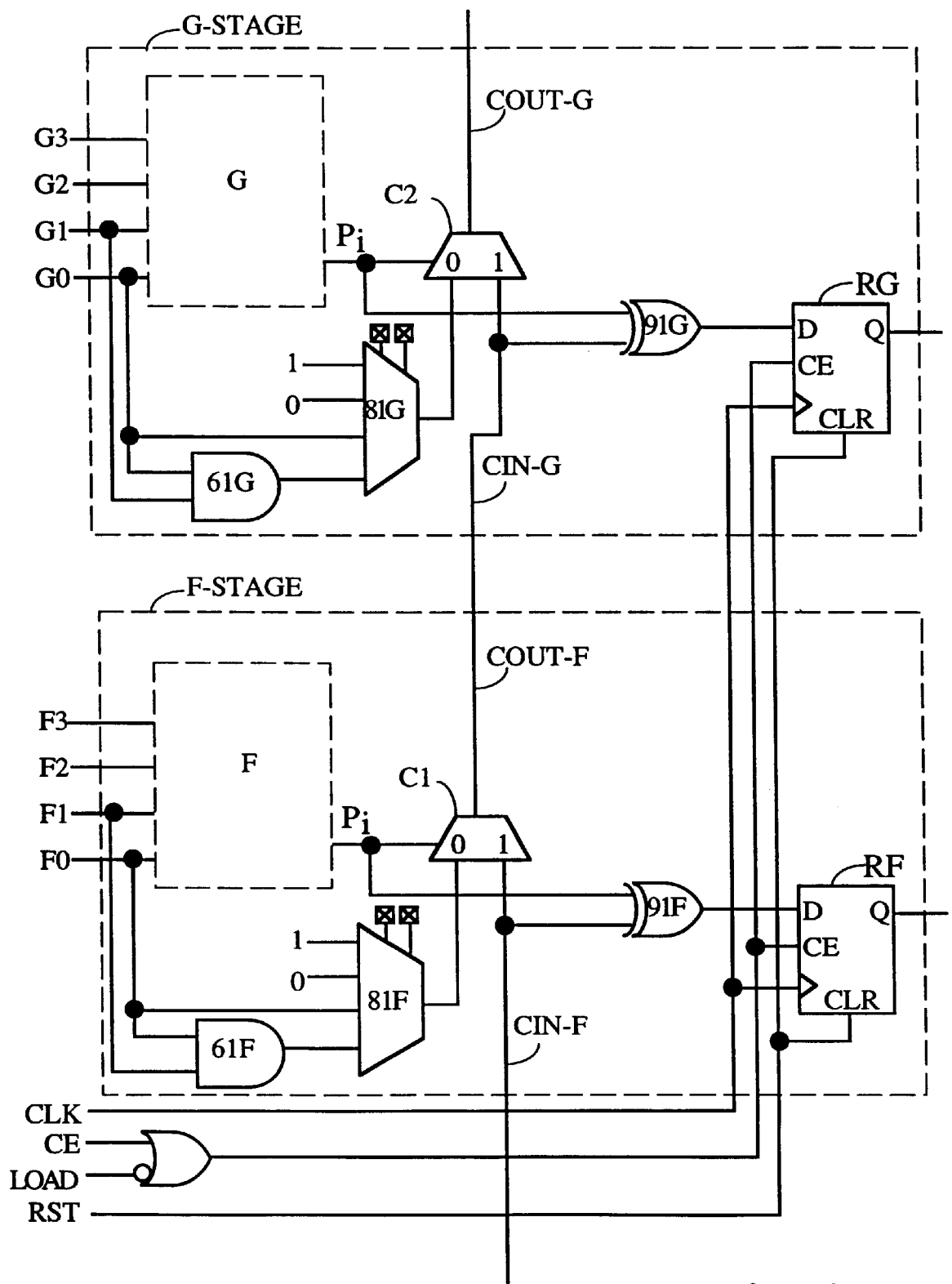
FIG. 3 shows another recent FPGA logic block architecture including an AND gate in parallel with a LUT, with which the invention may be used.

FIG. 3 shows an alternative structure also having a LUT with adjacent AND gate. In FIG. 3, a select multiplexer 81F or 81G can provide other signals to the carry multiplexer. In addition to the output of AND gate 61F or 61G, select multiplexer 81F or 81G can apply one of the LUT input signals or a constant 0 or 1, useful for introducing a signal to the carry chain.

Figure 4:
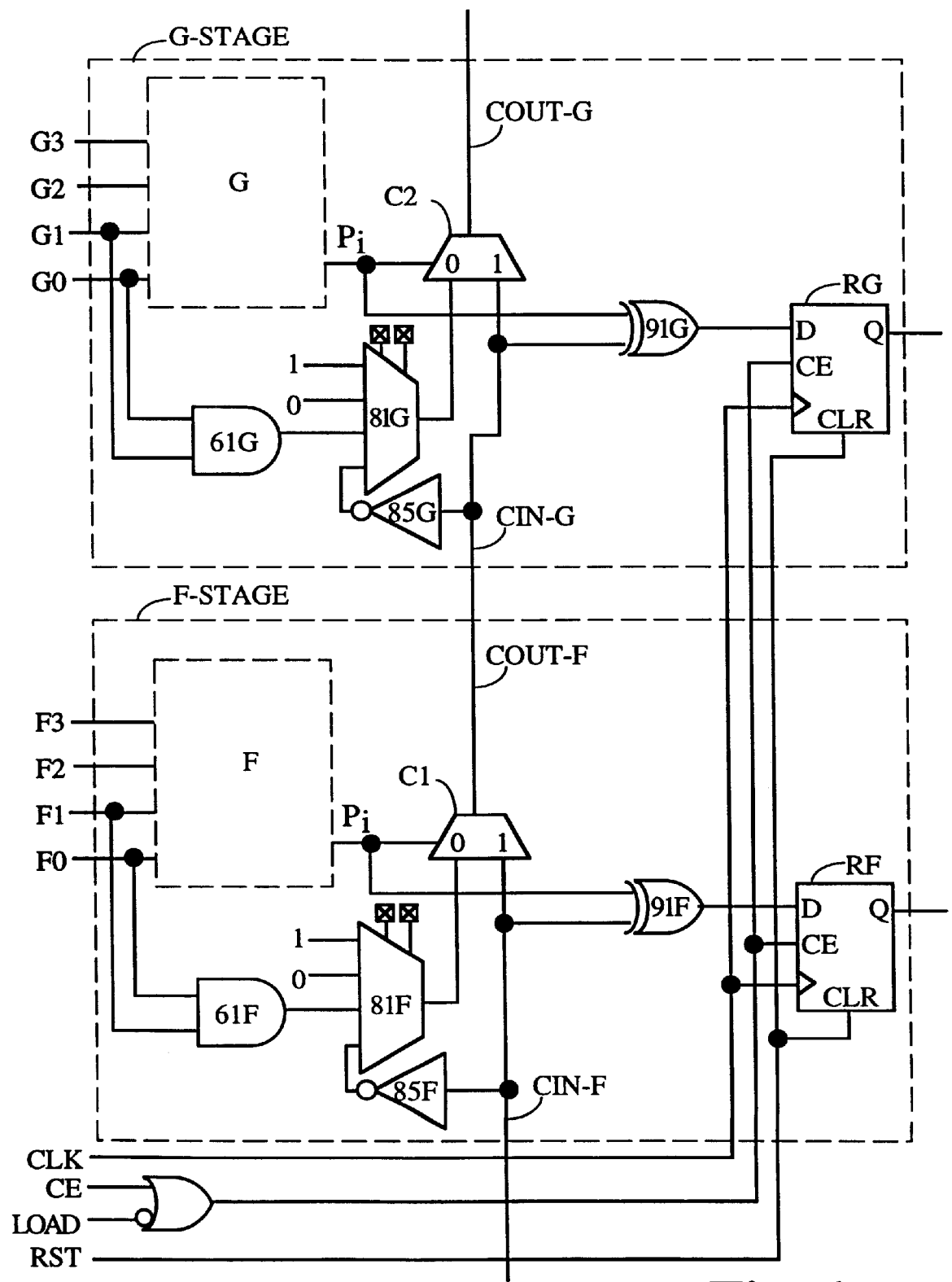
FIG. 4 shows yet another recent FPGA logic block architecture including an AND gate in parallel with a LUT, with which the invention may be used.

FIG. 4 shows another alternative structure with which the invention may be used. In FIG. 4, an inverter 85F or 85G applies the inverse of the carry chain signal to the select multiplexer. This allows the carry chain to be used for forming wide XOR functions, as discussed by Chaudhary in U.S. patent application Ser. No. 08/815,027. Additional details of structures with which the present invention can be used are further described by Young, Chaudhary, and Bauer in U.S. patent application Ser. No. 08/806,997 filed Feb. 26, 1997, the content of which is incorporated herein by reference.

It has not previously been known that the LUT with adjacent AND gate structure can also be effectively used to form a loadable counter, particularly a counter that can switch from being an up-counter to being a down-counter.

Figure 5:
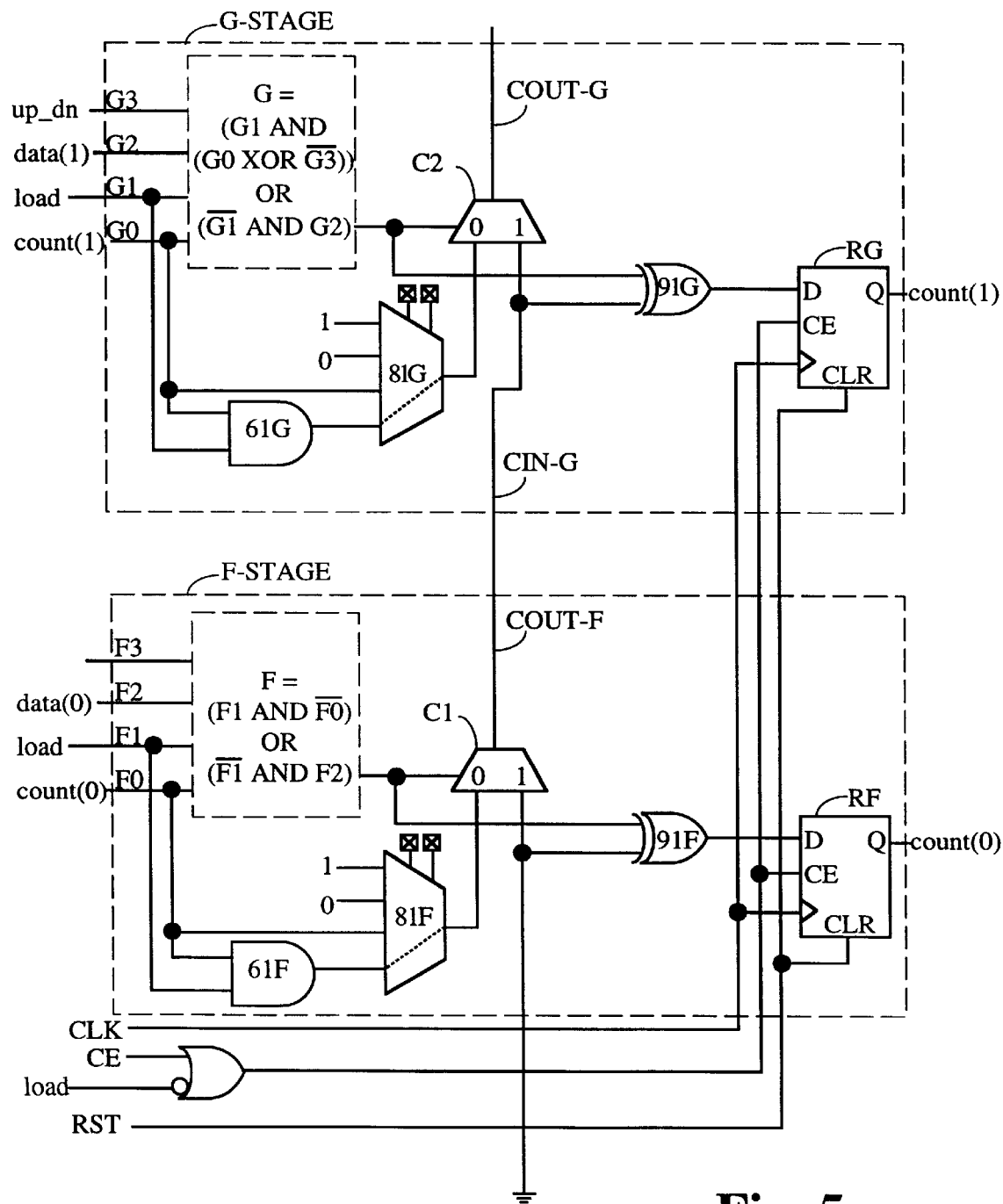
FIG. 5 shows an embodiment of the present invention.

FIG. 5 shows the structure of FIG. 3 configured to form a high density implementation of a loadable up-down counter with asynchronous reset. (The structures of FIGS. 2 and 4 can also be configured to form such a counter.)

The F-stage is shown as configured to implement the lowest bit of the counter. The G-stage of FIG. 5 can be replicated as many times as needed to implement the remaining bits in the desired counter. Select multiplexers 81F and 81G are configured to forward the outputs of AND gates 61F and 61G to the 0 input terminals of carry multiplexers C1 and C2. The up-down selector signal up_dn is applied to an input terminal F3 of LUT F and to an input terminal G3 of LUT G. The lowest order bit data(0) of the number to be loaded into the counter is applied to another input terminal F2 of LUT F. The next lowest order bit data(1) is applied to terminal G2 of LUT G. The loading control signal "load" is applied to yet another input terminal F1 of LUT F and to terminal G1 of LUT G. Finally, the output of register RF count(0) (the least significant bit of the counter) is applied to one of the input terminals F0 of LUT F. The output of register RG count(1) (the next least significant bit) is applied to input terminal G0 of LUT G.

LUT F is configured to implement the equation $$F = (F1 \text{ AND } \overline{F0}) \text{ OR } (\overline{F1} \text{ AND } F2).$$

LUT G is configured to implement the equation $$G = (G1 \text{ AND } ((G0 \text{ XOR } \overline{G3}))) \text{ OR } (\overline{G1} \text{ AND } G2)$$

This counter operates in two modes, a data loading mode and a counting mode. When the "load" signal is logic 0, the counter is operating in a data loading mode (loading the counter) and when the "load" signal is logic 1, the counter is operating in a counting mode. If the up-down signal up_dn is logic 1, the counter counts up. If the up-down signal up_dn is logic 0, the counter counts down.

Data Loading Mode

When the "load" signal is logic 0, the equations in LUTs F and G simplify to $$F = F2 \text{ and } G = G2$$

Thus in data loading mode, data(0) and data(1) are applied to the output terminals of LUTs F and G. Since the "load" signal is logic 0, AND gates 61F and 61G output a logic 0 signal and thus the entire carry chain is disabled and carries a logic 0 signal. Thus XOR gates 91F and 91G do not invert the F and G output values, and the data values in LUTs F and G are thus moved to registers RF and RG on the next clock signal CLK. After the initial value has been loaded into the counter, the "load" signal goes to logic 1.

Counting Mode-Up

When the "load" signal is logic 1 (to cause counting), F1 and G1 are logic 1. If the counter is to count up, the up_dn signal on G3 is logic 1, and the logic equations in LUTs F and G simplify to $$F = \overline{F0} \text{ and } G = G0$$

Thus, if the lowest order bit count(0) is a logic 1, it switches to logic 0 at the next clock cycle. If the next lowest order bit count(1) is logic 1, then XOR gate 91G combines the logic 1 count(1) signal with the logic 1 count(0) signal and a logic 0 is loaded into register RG at the next clock cycle CLK. Thus the number 11 has become 00 and the counter has counted up (a logic 1 will be passed up the carry chain to the next highest bit).

Counting Mode-Down

If the counter is to count down, the behavior of LUT F doesn't change (the lowest order bit switches at every clock cycle regardless of whether the counter is counting up or down). However, the up_dn signal on G3 is logic 0 and thus LUT G implements the function $$G = \overline{G0}$$

Thus when count(1) is logic 1, LUT G outputs logic 0. XOR gate 91G combines this with the logic 1 count(0) value to provide logic 1 to register RG at the next clock cycle. Thus a value 11 has become 10 and the counter has counted down.

In summary, AND gates 61F and 61G allow the carry chain to be disabled during loading and allow a count value to be applied to the carry chain during counting.

The above description refers to field programmable logic devices with which the invention may be used. The invention may also be used with factory programmable devices having the elements specified in the claims. In light of the above disclosure, other embodiments of the invention will become obvious to those skilled in the art and those embodiments are intended to fall within the scope of the present invention.

For example, although the above description has focused on a loadable counter, the principles of the invention can also be applied to loadable accumulators, adders, and subtractors. For loadable adders and subtractors, the up_dn input is replaced by one of the adder or subtractor input bits.

I claim:

1. A loadable up-down counter implemented in an FPGA comprising a plurality of stages, each stage providing one counter bit and comprising:

a register providing a counter bit output signal G0;

a four-input LUT programmed to generate the function $$G = (G1 \text{ AND } ((G0 \text{ XOR } \overline{G3}))) \text{ OR } (\overline{G1} \text{ AND } G2)$$

and receiving:
   the counter bit output signal G0,
   a load signal G1,
   an up-down signal G3, and
   a starting data value G2;

an AND gate receiving the load signal G1 and the counter bit output signal G0 and providing an AND gate output signal; and a carry multiplexer providing a carry multiplexer output signal, and receiving as input signals the AND gate output signal and a carry multiplexer output signal from another stage.

2. A loadable up-down counter as in claim 1 wherein the register further comprises a clock enable terminal controlling whether the register responds to a clock signal, the clock enable terminal being connected to receive the load signal G1.

3. A loadable up-down counter as in claim 1 wherein the register further comprises an asynchronous terminal for resetting the register, the asynchronous terminal being connected to receive a reset signal.

4. A loadable up-down counter as in claim 1 wherein a select multiplexer provides the AND gate output signal as an input signal to the carry multiplexer.

5. A loadable up-down counter as in claim 1 further comprising a first stage providing the least significant counter bit and comprising:

a register providing the least significant counter bit output signal F0;

a LUT programmed to generate the function $$F = (F1 \text{ AND } \overline{F0}) \text{ OR } (\overline{F1} \text{ AND } F2)$$

and receiving
- the least significant counter bit output signal F0,
- a load signal F1,
- a starting data value F2;

an AND gate receiving the load signal F1 and the least significant counter bit output signal F0 and providing an AND gate output signal; and a carry multiplexer providing a carry multiplexer output signal, and receiving as input signals the AND gate output signal and a logic 0 input signal.

6. A method of implementing a loadable up-down counter in an FPGA, comprising:

programming a configurable logic element (CLE) to generate the function $$G = (G1 \text{ AND } ((G0 \text{ XOR } \overline{G3})) \text{ OR } (\overline{G1} \text{ AND } G2);$$

providing a register to store a counter bit output signal G0;

providing the counter bit output signal G0, a load signal G1, a starting data value G2, and an up-down signal G3 as inputs to the CLE;

providing an AND gate having an output signal, and receiving the load signal G1 and the counter bit output signal G1 as input signals; and providing a carry multiplexer having an output signal, and receiving as input signals the AND gate output signal and a carry multiplexer output signal from another stage.

7. The method of claim 6, further comprising the steps of:

programming a second CLE to generate the least significant bit function $$F = (F1 \text{ AND } \overline{F0}) \text{ OR } (\overline{F1} \text{ AND } F2)$$

providing a register to store a counter bit output signal F0, providing the counter bit output signal F0, a load signal F1, a starting data value F2, and up-down signal F3 as inputs to the CLE;

providing an AND gate having an output signal, and receiving the load signal F1 and the counter bit output signal F0; and providing a carry multiplexer with an output signal, and receiving as input signals the AND gate output signal and a logic 0 input signal.

* * * * *